US010276392B2

(12) United States Patent
Chen et al.

(10) Patent No.: US 10,276,392 B2
(45) Date of Patent: Apr. 30, 2019

(54) LOADING EFFECT REDUCTION THROUGH MULTIPLE COAT-ETCH PROCESSES

(71) Applicant: Taiwan Semiconductor Manufacturing Co., Ltd., Hsinchu (TW)

(72) Inventors: Jin-Dah Chen, Hsinchu (TW); Ming-Feng Shieh, Tainan (TW); Han-Wei Wu, Tainan (TW); Yu-Hsien Lin, Kaohsiung (TW); Po-Chun Liu, New Taipei (TW); Stan Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/642,559

(22) Filed: Jul. 6, 2017

(65) Prior Publication Data
US 2017/0309718 A1 Oct. 26, 2017

Related U.S. Application Data

(62) Division of application No. 15/079,436, filed on Mar. 24, 2016, now Pat. No. 9,711,604.

(Continued)

(51) Int. Cl.
*H01L 21/306* (2006.01)
*H01L 21/283* (2006.01)
(Continued)

(52) U.S. Cl.
CPC ........ *H01L 21/283* (2013.01); *H01L 21/3085* (2013.01); *H01L 21/30604* (2013.01);
(Continued)

(58) Field of Classification Search
CPC ..................... H01L 21/30604; H01L 21/3085
See application file for complete search history.

(56) References Cited

U.S. PATENT DOCUMENTS 8,039,179 B2  10/2011  Shieh et al.
8,202,681 B2   6/2012  Lin et al.
(Continued)

FOREIGN PATENT DOCUMENTS

KR    20150095171 A   8/2015
TW       552317 B    9/2003
(Continued)

OTHER PUBLICATIONS

Taiwanese Office Action for Application No. 105126796, dated Jan. 5, 2017, 3 pgs.

*Primary Examiner* — Douglas M Menz
(74) *Attorney, Agent, or Firm* — Haynes and Boone, LLP

(57) ABSTRACT

First, second, and third trenches are formed in a layer over a substrate. The third trench is substantially wider than the first and second trenches. The first, second, and third trenches are partially filled with a first conductive material. A first anti-reflective material is coated over the first, second, and third trenches. The first anti-reflective material has a first surface topography variation. A first etch-back process is performed to partially remove the first anti-reflective material. Thereafter, a second anti-reflective material is coated over the first anti-reflective material. The second anti-reflective material has a second surface topography variation that is smaller than the first surface topography variation. A second etch-back process is performed to at least partially remove the second anti-reflective material in the first and second trenches. Thereafter, the first conductive material is partially removed in the first and second trenches.

20 Claims, 15 Drawing Sheets

Related U.S. Application Data

(60) Provisional application No. 62/273,522, filed on Dec. 31, 2015.

(51) Int. Cl.
    *H01L 21/308* (2006.01)
    *H01L 21/8234* (2006.01)
    *H01L 29/49* (2006.01)
    *H01L 29/66* (2006.01)
    *H01L 29/78* (2006.01)
    *H01L 29/51* (2006.01)

(52) U.S. Cl.
    CPC .. *H01L 21/823456* (2013.01); *H01L 29/4966* (2013.01); *H01L 29/66545* (2013.01); *H01L 29/78* (2013.01); *H01L 29/517* (2013.01)

(56) References Cited

U.S. PATENT DOCUMENTS

| | | |
|---|---|---|
| 8,216,767 B2 | 7/2012 | Wang et al. |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,728,332 B2 | 5/2014 | Lin et al. |
| 8,741,551 B2 | 6/2014 | Wu et al. |
| 8,822,243 B2 | 9/2014 | Yan et al. |
| 2006/0091468 A1 | 5/2006 | Liaw |
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2013/0323641 A1 | 12/2013 | Chang |
| 2014/0008720 A1* | 1/2014 | Xie ............ H01L 27/092 257/331 |
| 2014/0011133 A1 | 1/2014 | Liu et al. |
| 2014/0017615 A1 | 1/2014 | Chang |
| 2014/0017616 A1 | 1/2014 | Chang |
| 2014/0051225 A1* | 2/2014 | Chang ........ H01L 21/82384 438/404 |
| 2014/0065843 A1 | 3/2014 | Chang et al. |
| 2014/0070320 A1* | 3/2014 | Mukherjee, Sr. .............. H01L 21/82345 257/368 |
| 2014/0117563 A1 | 5/2014 | Yu et al. |
| 2014/0120459 A1 | 5/2014 | Liu et al. |
| 2014/0186773 A1 | 7/2014 | Chang |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0255850 A1 | 9/2014 | Chang et al. |
| 2014/0264760 A1 | 9/2014 | Chang et al. |
| 2014/0264899 A1 | 9/2014 | Chang et al. |
| 2014/0272709 A1 | 9/2014 | Liu et al. |
| 2014/0272726 A1 | 9/2014 | Chang |
| 2014/0273442 A1 | 9/2014 | Liu et al. |
| 2014/0273446 A1 | 9/2014 | Huang et al. |
| 2014/0273521 A1 | 9/2014 | Wu et al. |
| 2014/0306273 A1* | 10/2014 | Ho ............ H01L 21/28088 257/288 |
| 2014/0361380 A1* | 12/2014 | Kim ............ H01L 21/82388 257/369 |
| 2017/0012107 A1* | 1/2017 | Park ............ H01L 29/4966 |

FOREIGN PATENT DOCUMENTS

| | | |
|---|---|---|
| TW | 200501399 A | 1/2005 |
| TW | 200847342 A | 12/2008 |
| TW | 201421676 A | 6/2014 |

\* cited by examiner

LOADING EFFECT REDUCTION THROUGH MULTIPLE COAT-ETCH PROCESSES

PRIORITY DATA

This application is a division of U.S. patent application Ser. No. 15/079,436, filed Mar. 24, 2016, now U.S. Pat. No. 9,711,604, which claims priority to Provisional Patent Application No. 62/273,522, filed Dec. 31, 2015, the disclosures of which are hereby incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. For example, as the device sizes become smaller, variations in device density or size across different parts of the semiconductor device may cause loading problems. The loading problems may lead to undesirably high resistance, for example.

Therefore, while existing semiconductor fabrication technologies have been generally adequate for their intended purposes, they have not been entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
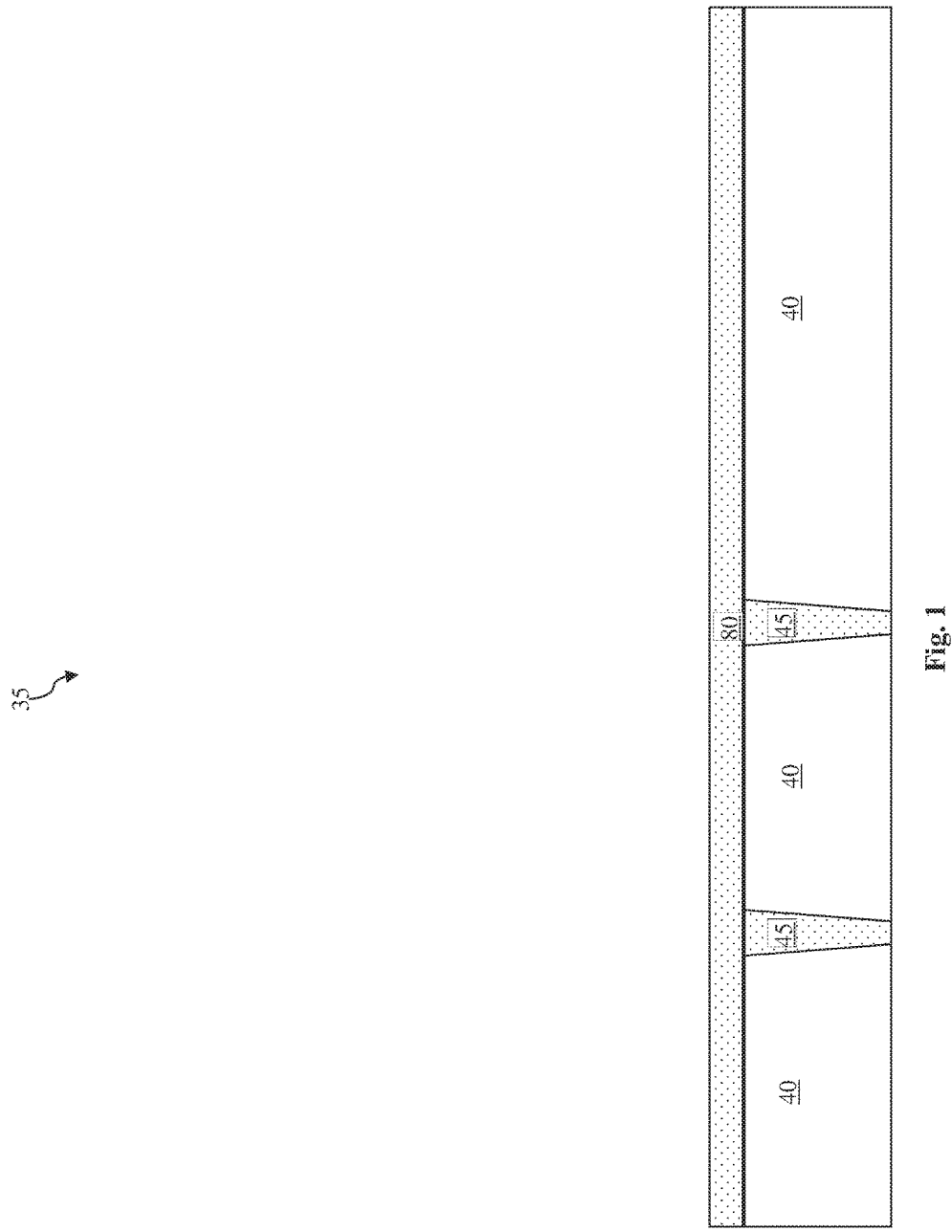
FIGS. 1-14 are diagrammatic fragmentary cross-sectional side views of a semiconductor device at various stages of fabrication in accordance with embodiments of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

FIGS. 1-14 are diagrammatic fragmentary cross-sectional side views of a semiconductor device 35 undergoing various stages of fabrication according to embodiments of the present disclosure. The semiconductor device 35 has a substrate 40. In some embodiments, the substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi-layer), may be strained for performance enhancement, and may include a silicon-on-insulator (SOI) structure.

Referring back to FIG. 1, shallow trench isolation (STI) features 45 are formed in the substrate 40. The STI features 45 are formed by etching recesses (or trenches) in the substrate 45 and filling the recesses with a dielectric material. In the present embodiment, the dielectric material of the STI features 45 includes silicon oxide. In alternative embodiments, the dielectric material of the STI features 45 may include silicon nitride, silicon oxy-nitride, fluoride-doped silicate (FSG), and/or a low-k dielectric material known in the art. In other embodiments, deep trench isolation (DTI) features may be formed in place of, or in combination with, the STI features 45.

A dummy gate dielectric layer 80 is formed over the substrate 40. The dummy gate dielectric layer 80 may contain a dielectric material such as silicon oxide or silicon nitride. The dummy gate dielectric layer 80 will be removed as a part of a gate replacement process discussed below.

Figure 2:
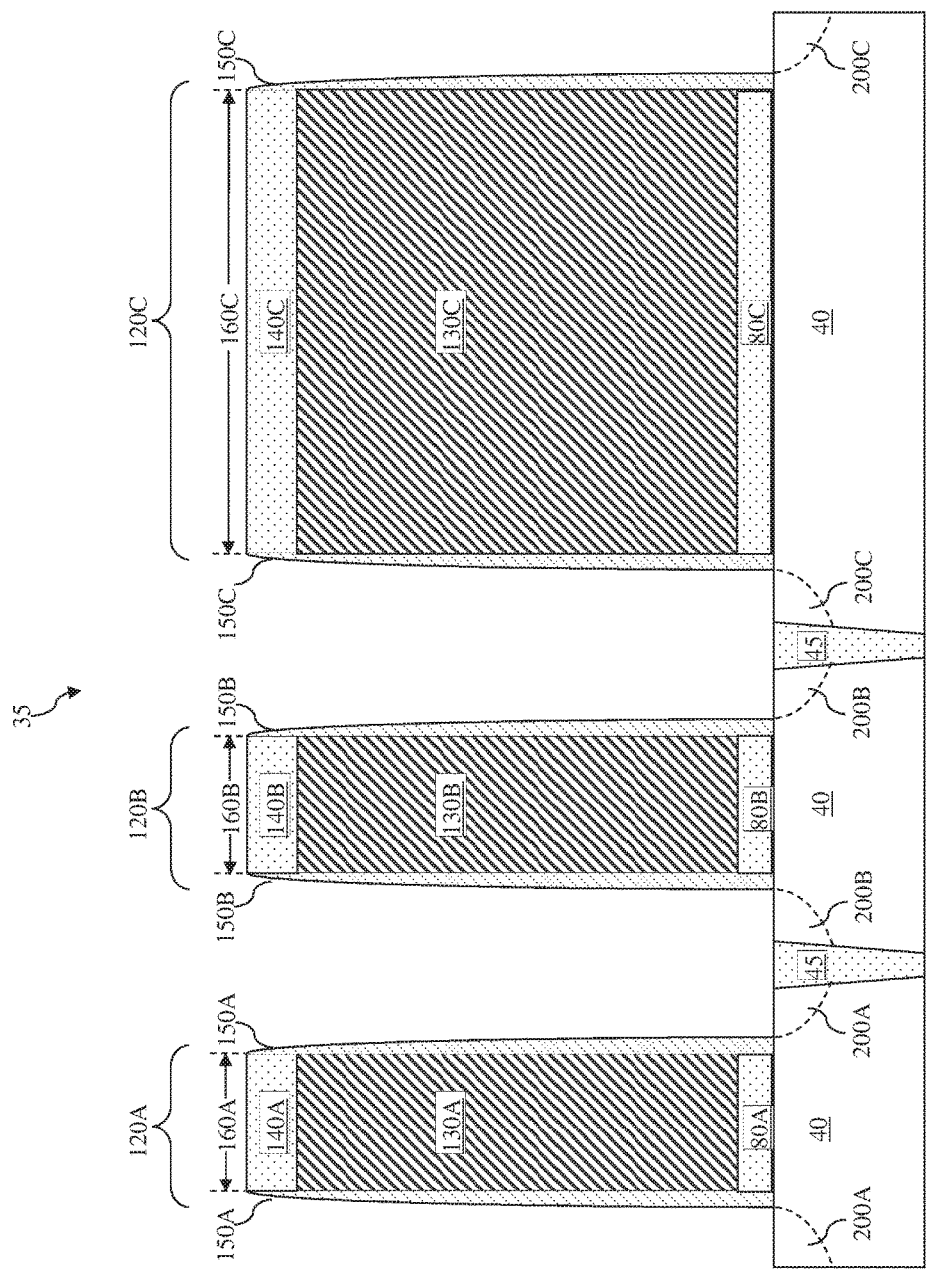

Referring now to FIG. 2, gate structures 120A, 120B, and 120C are formed over the substrate 40. The gate structure 120A includes dummy gate dielectric film 80A, dummy gate electrode 130A, and spacers 150A. The gate structure 120B includes dummy gate dielectric film 80B, dummy gate electrode 130B, and spacers 150B. The gate structure 120C includes dummy gate dielectric film 80C, dummy gate electrode 130C, and spacers 150C.

The formation of the gate structures 120A-120B may include depositing a gate electrode layer 130 and thereafter patterning the gate electrode layer 130 and the layers therebelow (e.g., the dummy gate dielectric layer 80) with patterned hard masks 140A, 140B, and 140C, respectively. The gate electrodes 130A, 130B, and 130C are dummy gate electrodes for the gate structure 120B. In some embodiments, the gate electrodes 130A, 130B, and 130C each include a polysilicon material. These dummy gate electrodes 130A, 130B, and 130C will be removed and replaced by functional (e.g., metal) gate electrodes in a gate replacement process discussed below.

The hard masks 140A, 140B, and 140C include a dielectric material, such as silicon oxide or silicon nitride. The gate spacers 150A, 150B, and 150C also include a dielectric material. In some embodiments, the gate spacers 150A, 150B, and 150C include silicon nitride. In alternative embodiments, the gate spacers 150A, 150B, and 150C may include silicon oxide, silicon carbide, silicon oxy-nitride, or combinations thereof.

The gate structure 120A is formed to have a lateral dimension 160A, the gate structure 120B is formed to have a lateral dimension 160B, and the gate structure 120C is formed to have a lateral dimension 160C. As is shown in FIG. 2, the lateral dimension 160C is substantially greater than the lateral dimensions 160A and 160B. In some embodiments, the lateral dimension 160C exceeds the lateral dimensions 160A or 160B by a factor of 3 or more. In other words, the gate structure 120C is at least 3 times as wide (or wider) than either the gate structure 120A or the gate structure 120B. Meanwhile, the lateral dimensions 160A and 160B may not be too different from one another. In some embodiments, the lateral dimensions 160A and 160B are equal to one another. In other embodiments, the lateral dimension 160A is within about 50% to about 200% of the lateral dimension 160B, or vice versa. The substantially greater lateral dimension 160C (compared to the lateral dimensions 160A or 160B) may cause loading problems, which will be discussed below in more detail.

Heavily doped source and drain regions 200A, 200B and 200C (also referred to as S/D regions) are formed in the substrate 40 after the formation of the gate structures 120A, 120B, and 120C. The heavily doped source/drain regions 200A are formed on opposite sides of the gate structure 120A, the heavily doped source/drain regions 200B are formed on opposite sides of the gate structure 120B, and the heavily doped source/drain regions 200C are formed on opposite sides of the gate structure 120C. The S/D regions 200A-200B may be formed by an ion implantation process or a diffusion process known in the art.

As is illustrated in FIG. 2, the source/drain regions 200A, 200B and 200C are aligned with the outer boundaries of the gate spacers 150A, 150B, and 150C, respectively. Since no photolithography process is required to define the area or the boundaries of the source/drain regions 200A, 200B, and 200C, it may be said that the source/drain regions 200A, 200B and 200C are formed in a "self-aligning" manner. One or more annealing processes are performed on the semiconductor device 35 to activate the source/drain regions 200A, 200B and 200C. It is also understood that in some embodiments, lightly-doped source/drain (LDD) regions may be formed in the substrate before the gate spacers are formed, but for reasons of simplicity, the LDD regions are not specifically illustrated herein.

Figure 3:
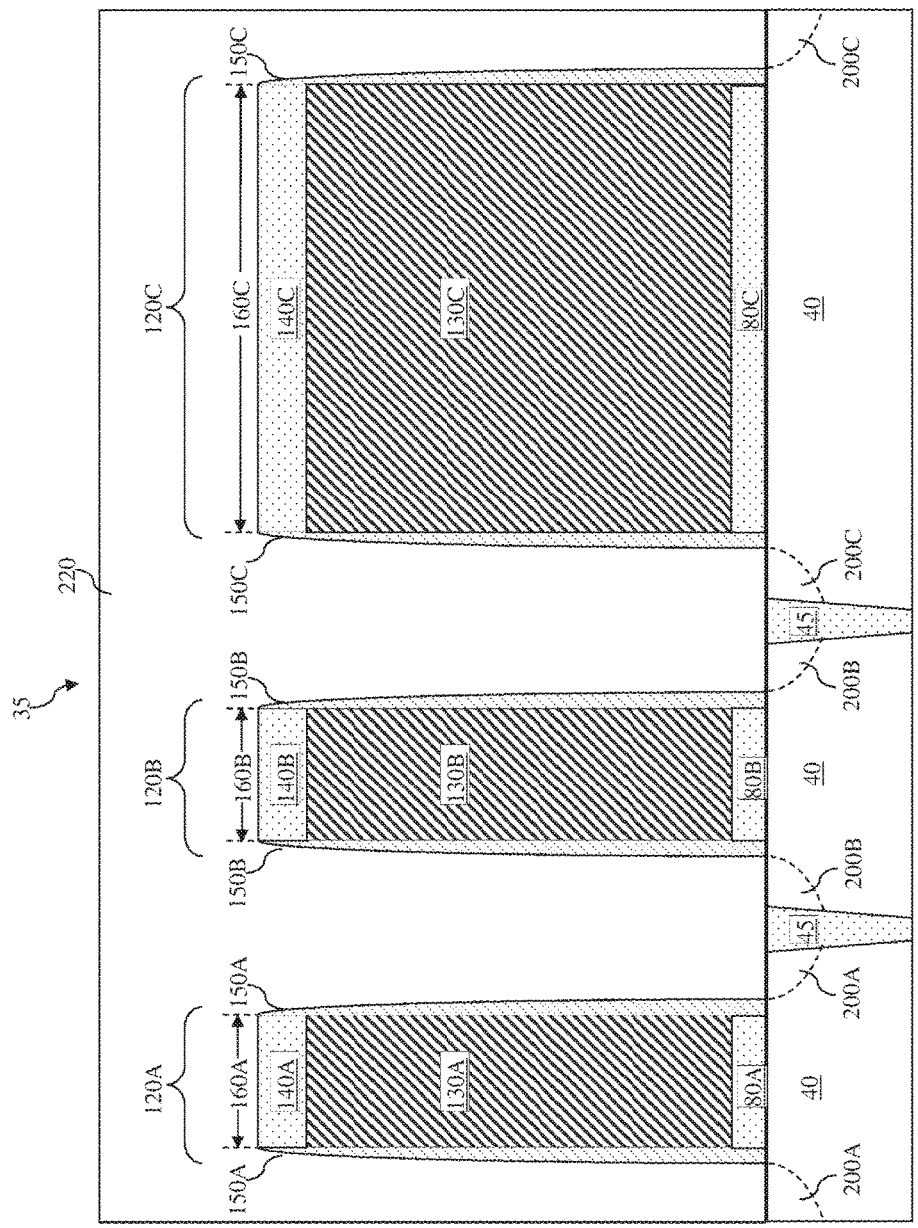

Referring now to FIG. 3, an inter-layer (or inter-level) dielectric (ILD) layer 220 is formed over the substrate 40 and over the gate structures 120A, 120B, and 120C. The ILD layer 220 may be formed by chemical vapor deposition (CVD), high density plasma CVD, spin-on, sputtering, or other suitable methods. In an embodiment, the ILD layer 220 includes silicon oxide. In other embodiments, the ILD layer 220 may include silicon oxy-nitride, silicon nitride, or a low-k material.

Figure 4:
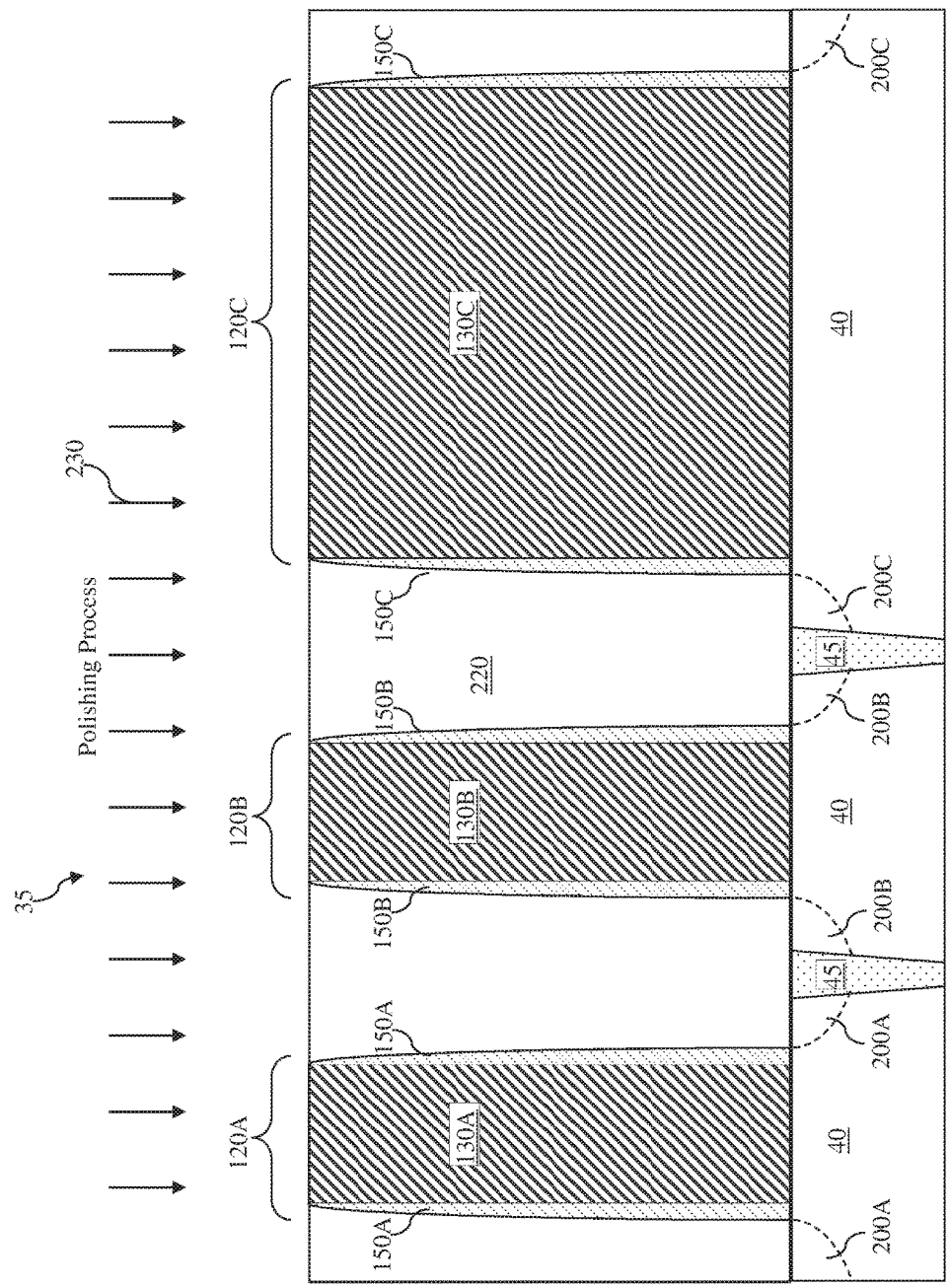

Referring to FIG. 4, a polishing process 230 (for example a chemical-mechanical-polishing (CMP) process) is performed on the ILD layer 220 to remove portions of the ILD layer 220. The polishing is performed until a top surface of the dummy gate electrodes of gate structures 120A, 120B and 120C is exposed. The hard masks 140A, 140B and 140C are also removed by the polishing process 230.

Figure 5:
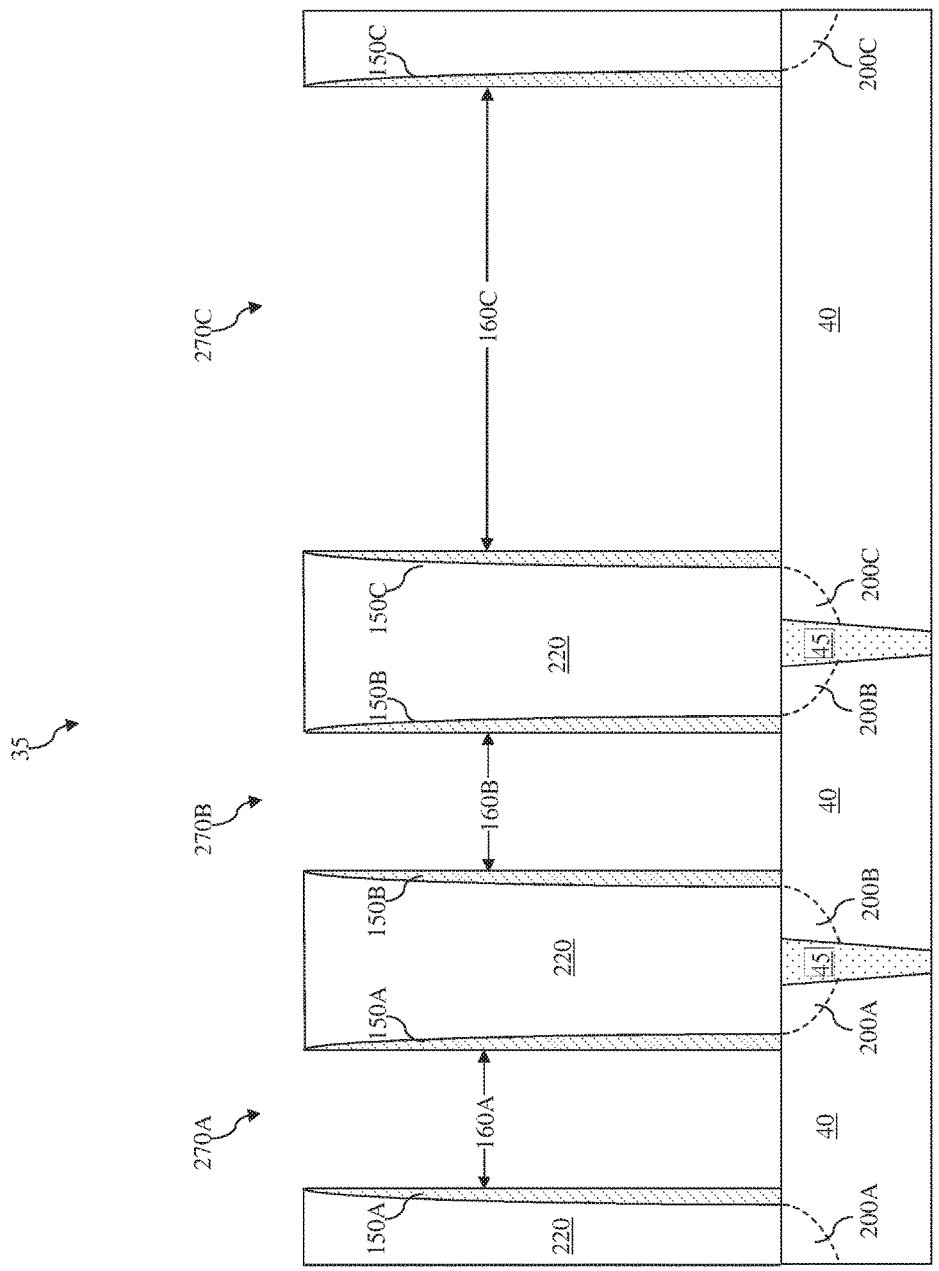

Referring now to FIG. 5, one or more etching processes may be performed to remove the dummy gate electrodes 130A, 130B, and 130C, thereby forming openings or trenches 270A, 270B, and 270C.

Figure 6:
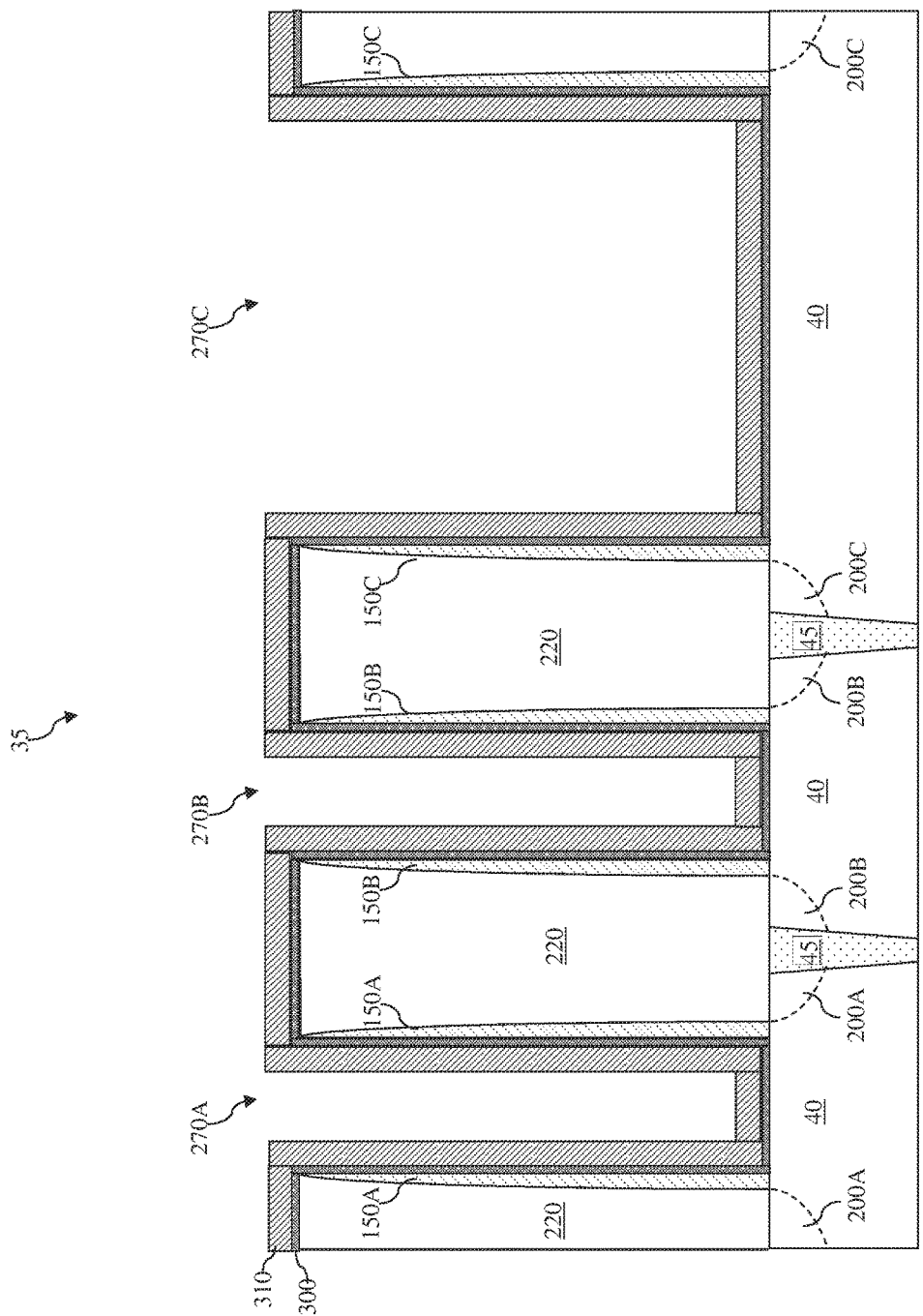

Referring to FIG. 6, a gate dielectric layer 300 is formed over the substrate 40 and over the ILD layer 220, partially filling the openings/trenches 270A, 270B, and 270C. In some embodiments, the gate dielectric layer 300 is formed by an atomic layer deposition (ALD) process. The gate dielectric layer 300 includes a high-k dielectric material. A high-k dielectric material is a material having a dielectric constant that is greater than a dielectric constant of $SiO_2$, which is approximately 4. In an embodiment, the gate dielectric layer 300 includes hafnium oxide ($HfO_2$), which has a dielectric constant that is in a range from approximately 18 to approximately 40. In alternative embodiments, the gate dielectric layer 300 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO.

It is understood that an interfacial layer may be optionally formed before the formation of the gate dielectric layer 300 in some embodiments. The interfacial layer may be formed by an atomic layer deposition (ALD) process and may contain silicon oxide ($SiO_2$). The gate dielectric layer 300 would then be formed on the interfacial layer.

A work function layer 310 is formed over the gate dielectric layer 300. The work function layer 310 contains a conductive material such as a metal or metal compound. In various embodiments, the work function layer 310 may contain materials such as titanium nitride (TiN) material, tungsten (W), tungsten nitride (WN), or tungsten aluminum (WAl). The work function layer 310 is configured to tune the work function of gates (to be formed in subsequent processes) of transistors, such that a desired threshold voltage may be achieved for the transistor. In some embodiments, the work function layer has a thickness in a range from about 10 angstroms to about 50 angstroms.

It is understood that a capping layer may also be formed between the gate dielectric layer 300 and the work function layer 310. In some embodiments, the capping layer contains a lanthanum oxide material (LaOx, where x is an integer). In other embodiments, the capping layer can contain rare earth oxides such as LaOx, GdOx, DyOx, or ErOx. The capping layer may work in conjunction with the work function layer 310 to help tune the work function of the gates.

Figure 7:
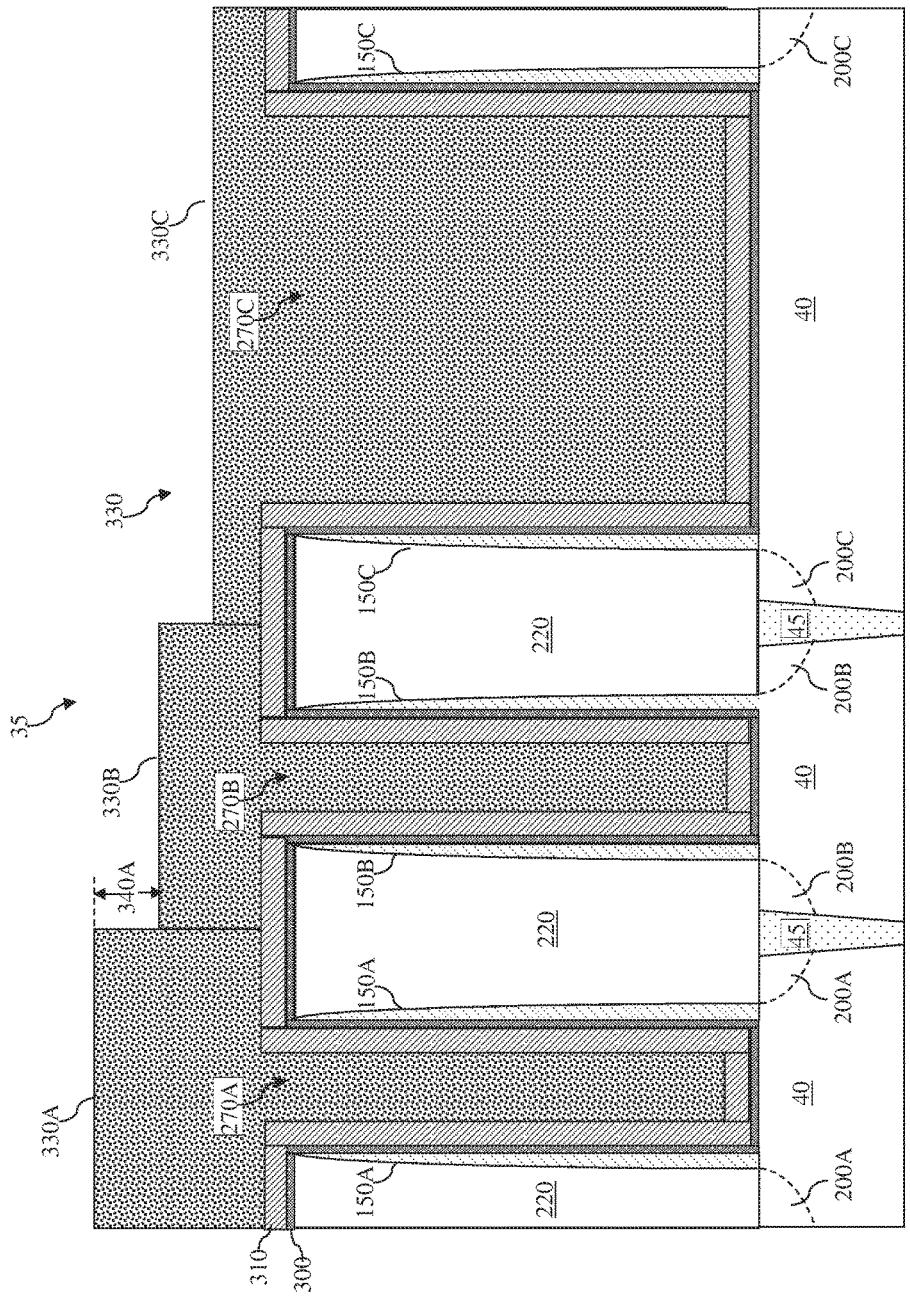

Referring now to FIG. 7, an anti-reflective material 330 is formed over the work function layer 310. The anti-reflective material 330 may be formed by a coating process. The anti-reflective material 330 completely fills the openings/trenches 270A, 270B, and 270C. In some embodiments, the anti-reflective material 330 includes a bottom anti-reflective coating (BARC), which may contain an organic material. The BARC material is configured to suppress problems associated with reflection by the layers below during a photolithography process to be performed subsequently.

As is shown in FIG. 7, a portion 330A of the anti-reflective material disposed above the opening/trench 270A has a greater height (i.e., taller) than a portion 330B of the anti-reflective material disposed above the opening/trench 270B, and the portion 330B of the anti-reflective material has a greater height (i.e., taller) than a portion 330C of the anti-reflective material disposed above the opening/trench 270C. For example, a height difference 340A exists between the portion 330A and the portion 330B of the anti-reflective material.

This height discrepancy or unevenness is caused by loading effects, for example due to the fact that the trench 270C is closed adjacent to, but is also substantially wider than, the trenches 270A and 270B. As advanced semiconductor fabrication technology nodes continue to shrink device sizes (including the respective sizes of the trenches 270A, 270B, and 270C), the loading effect may become exacerbated, which may manifest itself as an even greater unevenness among the upper surfaces of the different portions of the anti-reflective material 330. This issue, if left unaddressed, may lead to problems such as poor trench filling (especially in the trench 270A) during a metal gate electrode formation process discussed below. This could cause problems such as excessive resistance gate, among other drawbacks.

Figure 8:
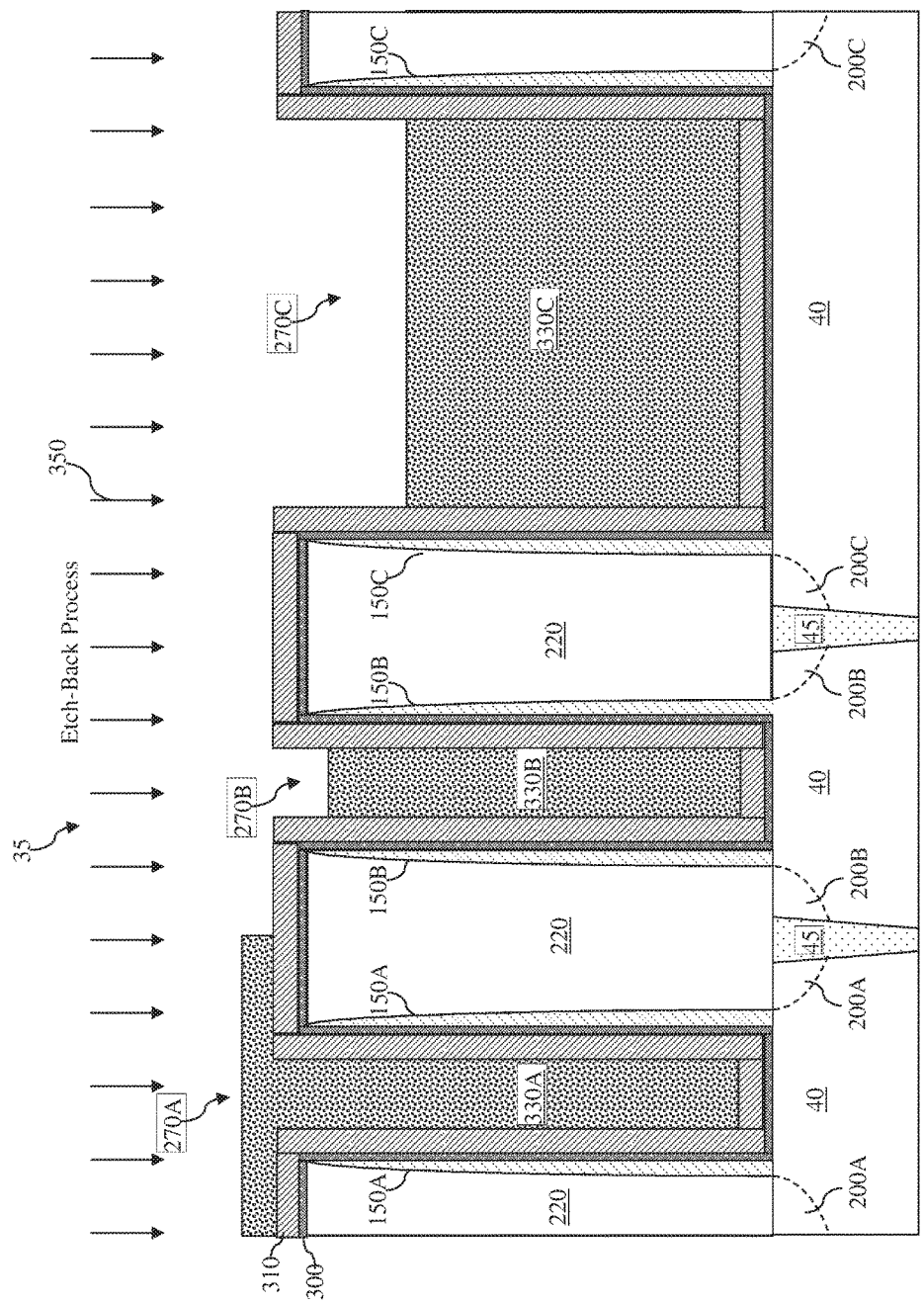

The present disclosure addresses this issue by performing multiple anti-reflective coating and etch-back processes. Referring now to FIG. 8, an etch-back process 350 is performed to the anti-reflective material 330. The etch-back process 350 is configured to etch away the anti-reflective material 330 without substantially etching the materials other than the anti-reflective material 330. For example, the work function layer 310 is substantially unaffected by the etch-back process 350.

In the embodiment shown in FIG. 8, after the performance of the etch-back process 350, the portion 330A of the anti-reflective material may be barely coming out of the opening/trench 270A, the portion 330B of the anti-reflective material may be partially filling the opening/trench 270B (i.e., a top portion of the opening/trench 270B is unfilled), and the portion 330C of the anti-reflective material may also be filling the opening/trench 270C. In other embodiments, the portion 330A of the anti-reflective material may also be sufficiently etched-back such that it no longer fills the opening/trench 270A completely. In any case, the end result of the etch-back process 350 is that the trenches 270A, 270B, and 270C are either filled or partially filled such that the aspect ratio (e.g., depth VS width) of the remaining "trench" is reduced, which will make any subsequent deposition in the trench easier.

Figure 9:
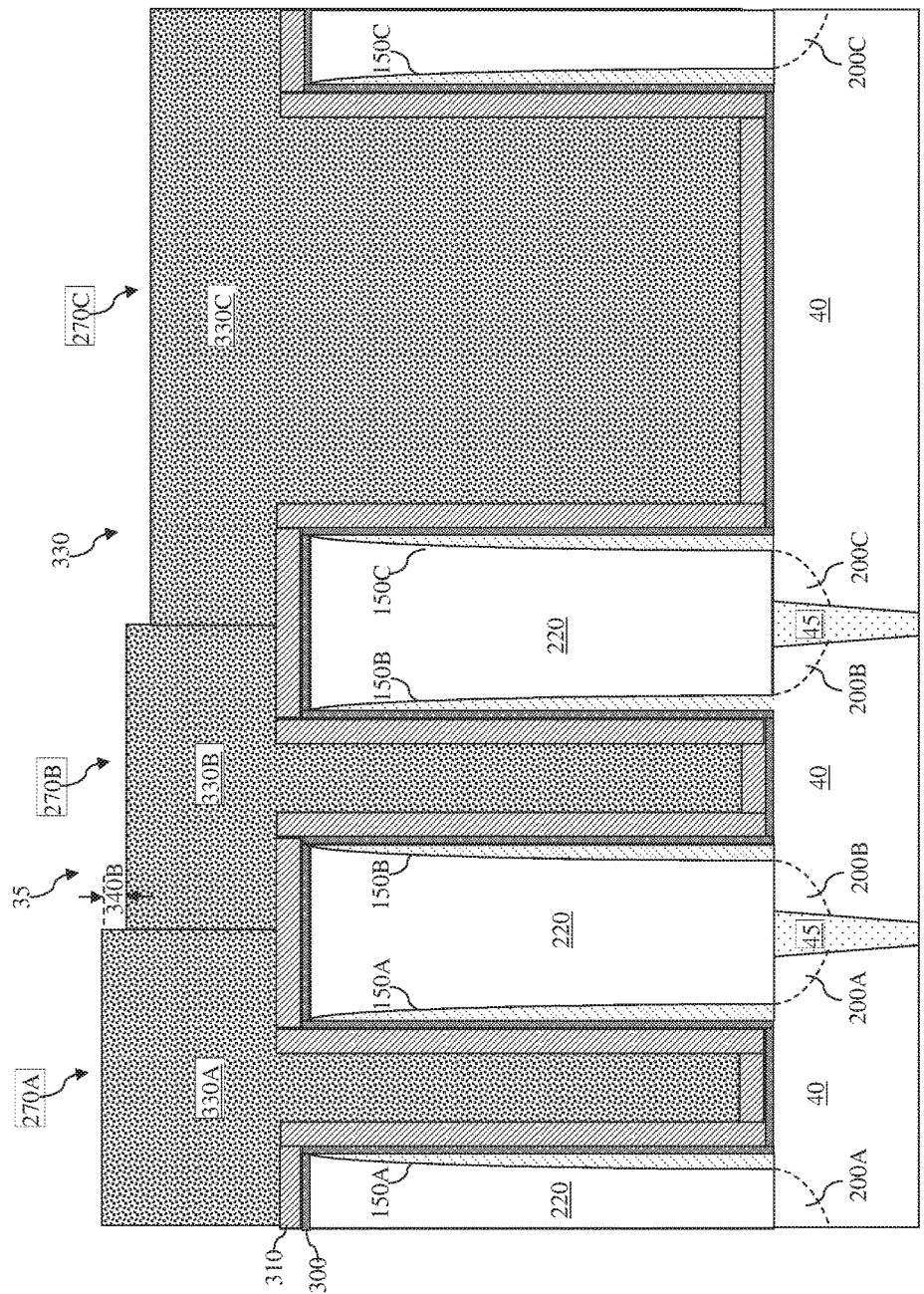

Referring now to FIG. 9, an additional coating process is performed to form additional anti-reflective material 330 over the existing anti-reflective material and over the work function metal layer 310. In some embodiments, the additional anti-reflective material 330 has the same material composition as the anti-reflective material 330 formed in the previous coating process discussed above with reference to FIG. 7. Consequently, the heights of the portions 330A, 330B, and 330C of the anti-reflective material are increased. However, the anti-reflective material 330 has a different surface topography than what is shown in FIG. 7 (i.e., before the etch-back process 350 was performed). In FIG. 7, the surface topography of the anti-reflective material 330 is such that the different portions 330A, 330B, 330C have relatively large differences in height, which as discussed above is caused by loading effects. In comparison, the surface topography of the anti-reflective material 330 in FIG. 9 is such that the height differences between the portions 330A, 330B, and 330C are reduced. Stated differently, the portion 330A may still be taller than the portion 330B, which may still be taller than 330C, but the height difference between the portion 330A and 330B (or 330B and 330C) is substantially smaller than compared to the case in FIG. 7.

For example, a height difference 340B exists between the portion 330A and the portion 330B of the anti-reflective material. In some embodiments, the height difference 340B is reduced by at least 50% (or more) compared to the height difference 340A shown in FIG. 7. In some embodiments, the height difference 340B between the portions 330A and 330B in FIG. 9 may even reach 0. The reduction in the height difference 340A to 340B is attributed to the fact that the additional anti-reflective material 330 is coated on existing anti-reflective material 330 (shown in FIG. 8) and without having to fill deep trenches. Again, the etch-back process 350 performed in FIG. 8 reduces the effective aspect ratio of the trenches 270B and 270C. Shallower trenches are easier to fill, and this effectively reduces the loading effect discussed above. Consequently, the surface topography of the resulting anti-reflective material 330 is "flatter" after the second coating process, as shown in FIG. 9. This will lead to other improvements in later fabrication steps, as discussed in more detail below.

Figure 10:
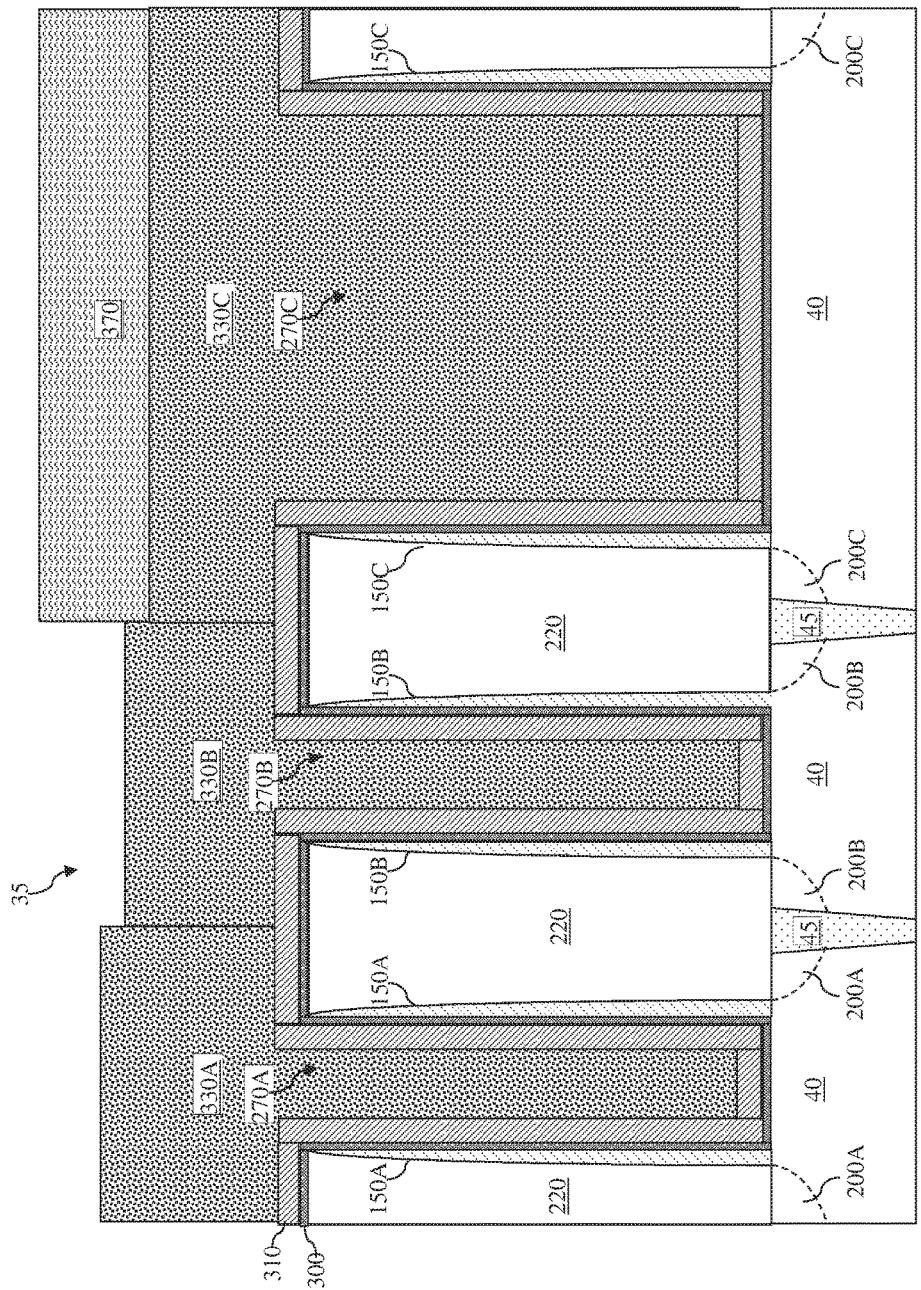

Referring now to FIG. 10, a photoresist material 370 is formed over the portion 330C of the anti-reflective material but not over the portions 330A and 330B of the anti-reflective material. The formation of the photoresist material 370 may involve one or more spin coating, exposing, developing, baking, and rinsing processes (not necessarily performed in that order). The photoresist material 370 may serve as a protective mask in a subsequent process.

Figure 11:
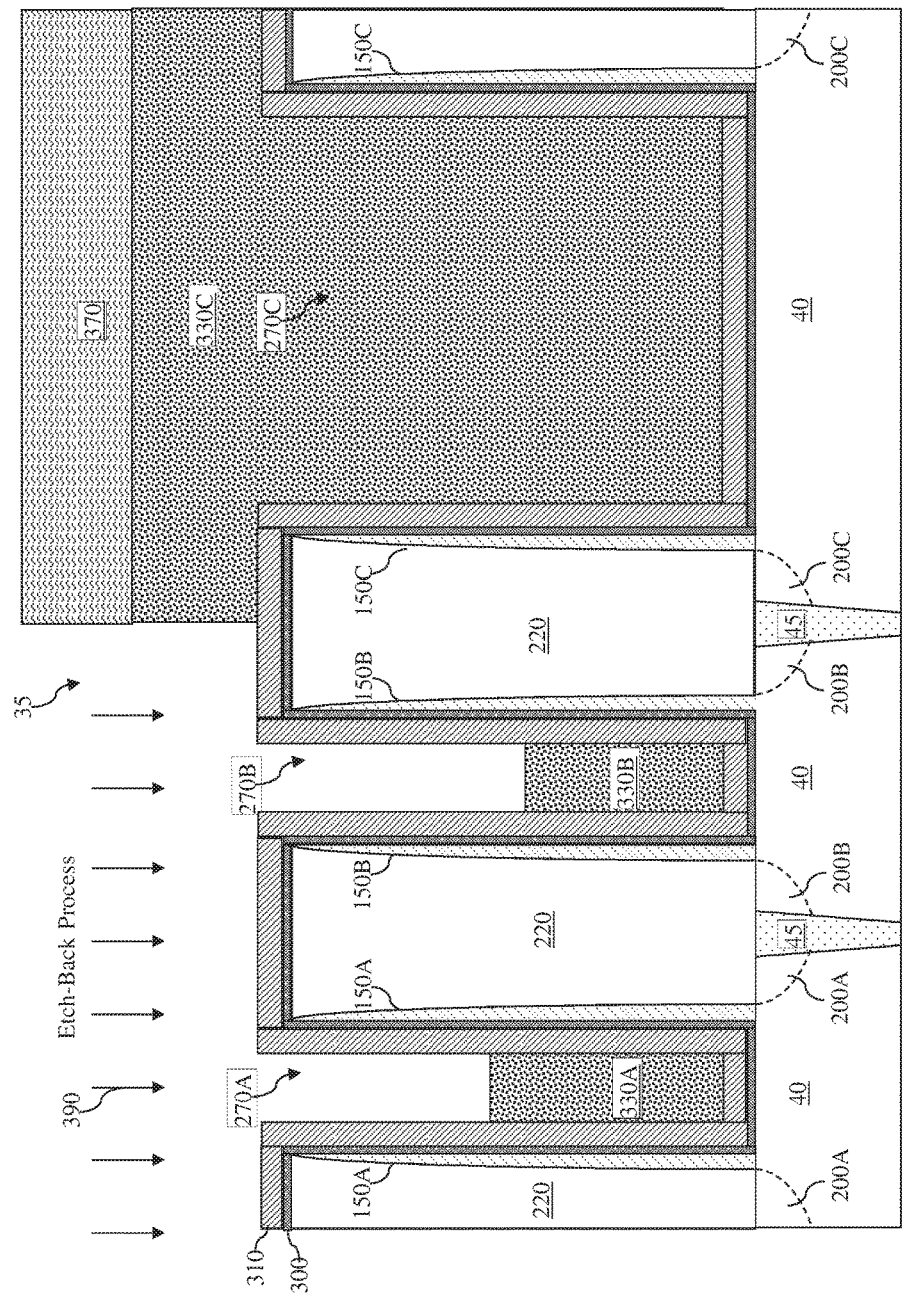

Referring to FIG. 11, an additional etch-back process 390 is performed to partially remove portions 330A and 330B of the anti-reflective material in the openings/trenches 270A and 270B. Meanwhile, the portion 330C of the anti-reflective material is protected by the photoresist material 370 and remains unaffected by the etch-back process 390. After the etch-back process 390 is performed, the height of the portion 330A of the anti-reflective material in the trench 270A is substantially reduced, as is the case for the portion 330B of the anti-reflective material in the trench 270B. In other words, a significant portion of the trench 270A (and the trench 270B) is now unoccupied by the anti-reflective material 330, which will allow another conductive material to be deposited therein in a subsequent process.

Also, since the height difference between the portions 330A and 330B of the anti-reflective material was already minimized as shown in FIG. 10, the height difference between them is still small after the etch-back process 390, as shown in FIG. 11. Had the height difference between the portions 330A and 330B not been minimized, the etch-back process 390 may either not remove enough of the portion 330A of the anti-reflective material in the trench 270A (which will adversely affect the subsequent metal filling process), or it may lead to an over-etching of the portion 330B of the anti-reflective material, which may not leave enough work function metal 310 in the trench 270B after a metal pullback process is performed subsequently. The present disclosure avoids either of these problems by repeating the coating and etch-hack processes, which as discussed above reduces the height difference between the portions 330A and 330B of the anti-reflective material filling their respective trenches 270A and 270B.

Figure 12:
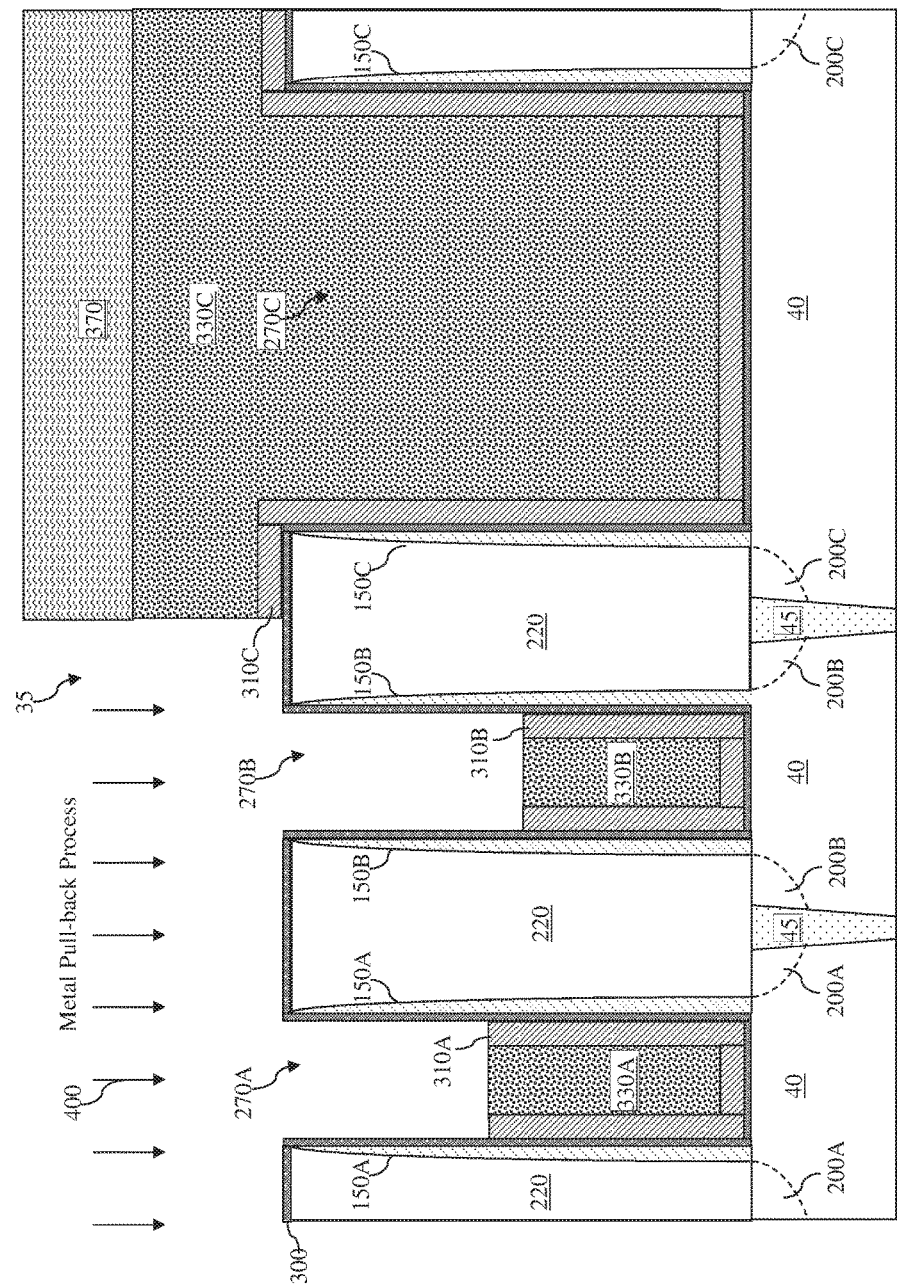

Referring now to FIG. 12, a metal pull-back process 400 is performed to remove portions of the work function layer 310 unprotected by the photoresist material 370. In some embodiments, the metal pull-back process 400 includes an etching process where the etchant is configured to remove the material of the work function layer 310 without substantially affecting other materials. As a result of the metal pull-back process 400 being performed, portions of the work function layer 310 disposed above the ILD layer 220 are removed, as well as portions of the work function layer 310 disposed on the sidewalls of the trenches 270A and 270B. The portions of the work function layer 310 in physical contact with the portions 330A and 330B of the anti-reflective material (in trenches 270A and 270B) are not removed, however. Thus, the metal pull-back process 400 forms a work function metal 310A in the trench 270A and a work function metal 310B in the trench 270B (as well as a work function metal 310C below the photoresist 370). These work function metals 270A, 270B, and 270C will serve as elements of their respective gate electrodes and help tune a work function of the respective gate, so that a desired threshold voltage Vt can be achieved.

Figure 13:
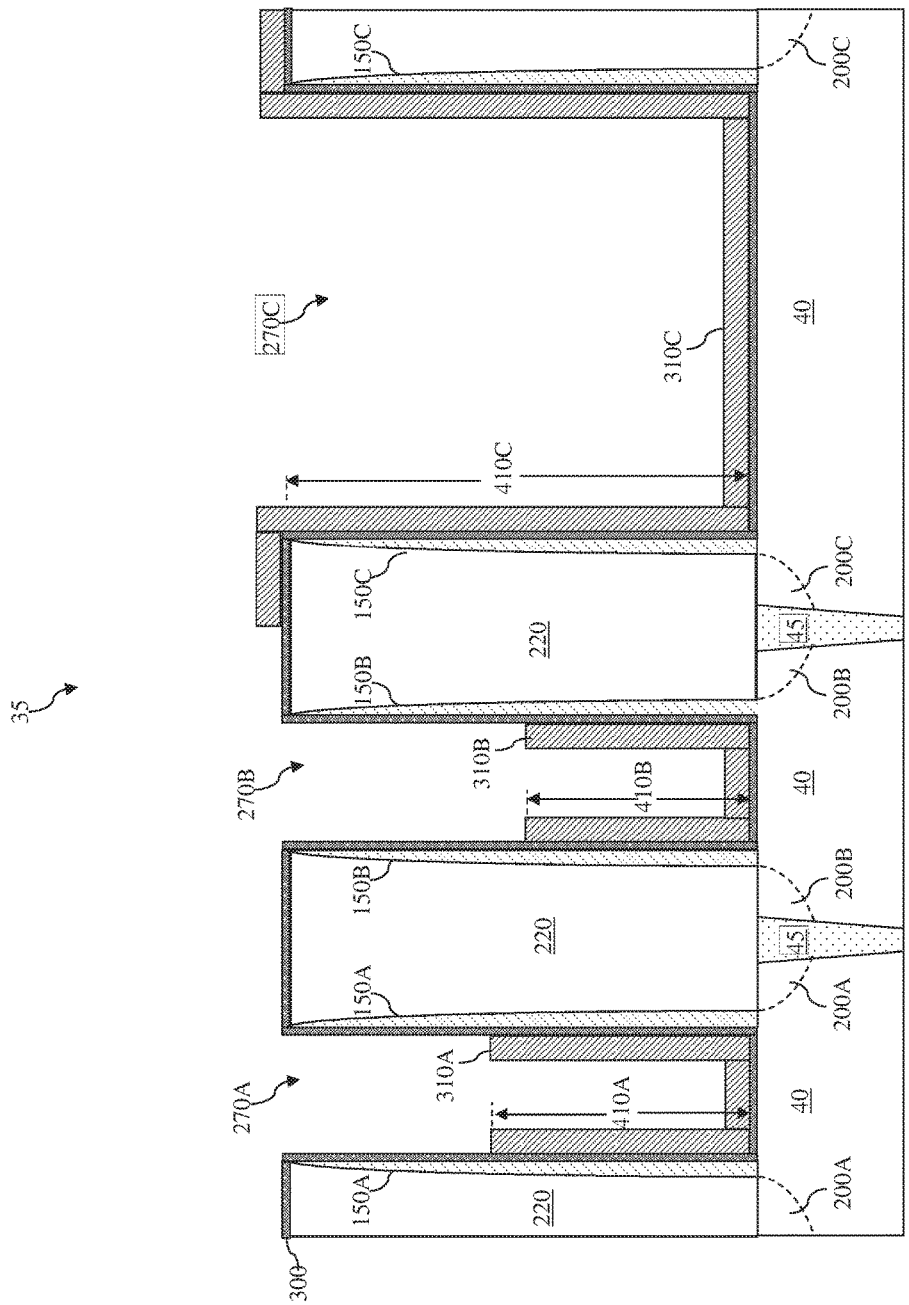

Referring now to FIG. 13, the photoresist material 370 is removed, for example using a photoresist stripping or ashing process. The anti-reflective material 330 is also removed. As such, the work function metals 310A, 310B, and 310C are exposed. Again, the work function metals 310A and 310B inherit the improved height uniformity from the previous fabrication stage shown in FIG. 12. In some embodiments, the work function metal 310A has a height 410A, and the work function metal 310B has a height 410B. Due to the multiple coating and etch-back processes performed according to the present disclosure, the difference between the height 410A and the height 410B is within (or no greater) than the height difference 340B (FIG. 9) between the portions 330A and 300B of the anti-reflective material. In other words, the height difference 340B may be largely inherited by the work function metals 310A and 310B.

In some embodiments, the height 410A and the height 410B can be controlled to be within a certain percentage from each other. For example, in some embodiments, the height 410A differs from the height 410B by no more than 60%, or vice versa. For example, if the height 410B is 100 angstroms, then the height 410A is less than 160 angstroms (i.e., +60% of 100 angstroms) and greater than 40 angstroms (i.e., −60% of 100 angstroms). In some other embodiments, the height 410A differs from the height 410B no more than 30%, or vice versa. For example, if the height 410B is 100 angstroms, then the height 410A is less than 130 angstroms (i.e., +30% of 100 angstroms) and greater than 70 angstroms (i.e., −30% of 100 angstroms). In some embodiments, the height 410A and the height 410B are controlled to be substantially equal to one another. It can also be seen from FIG. 13 that a height 410C of the portion of the work function metal 310C disposed within the trench 270C is substantially taller than the heights 410A and 410B.

Figure 14:
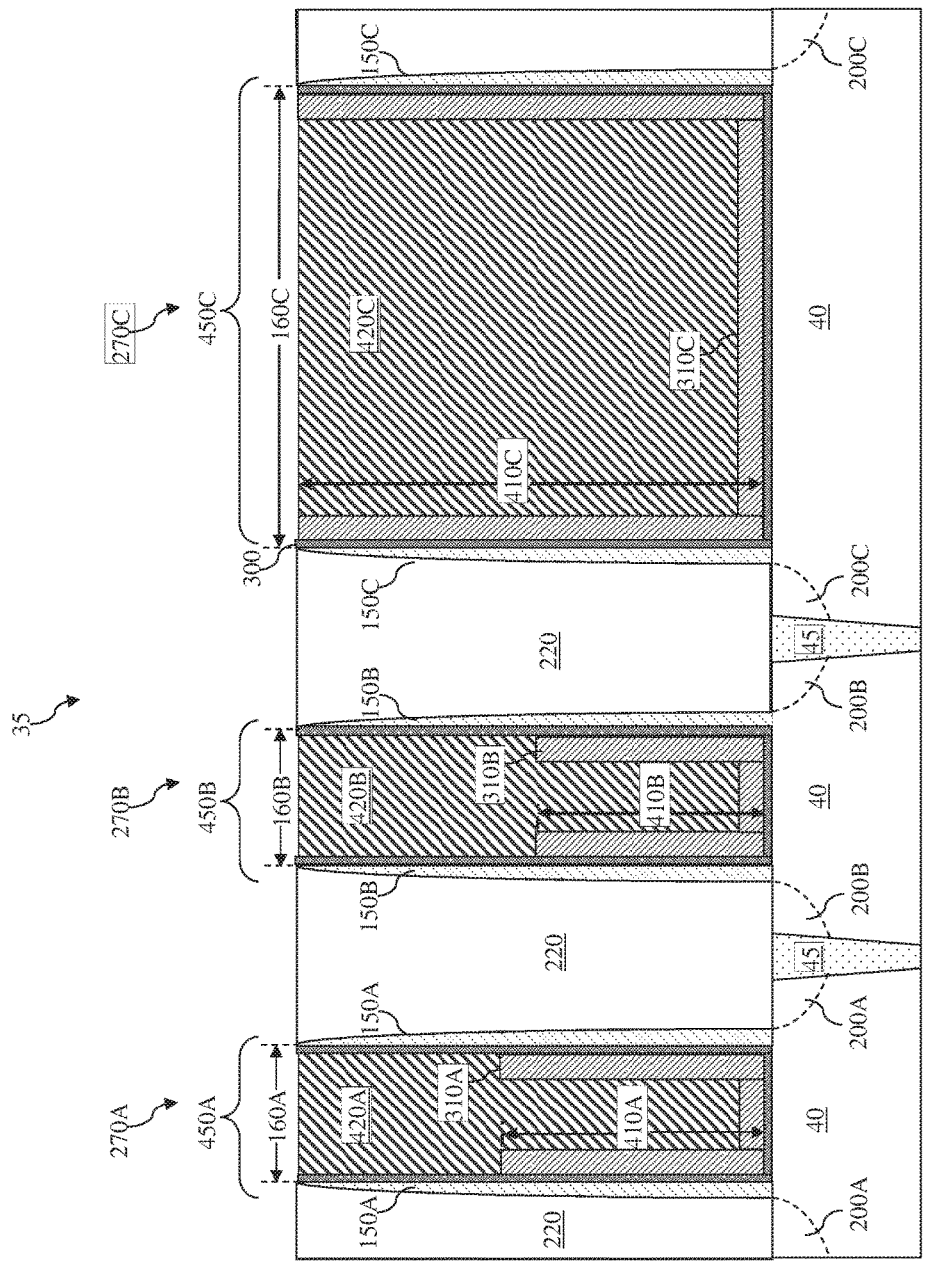

Referring now to FIG. 14, a conductive material is formed over the work function metals 310A, 310B, and 310C, thereby filling the openings/trenches 270A, 270B, 270C. A planarization process (e.g., a CMP process) is then performed to remove excessive portions of the conductive material (as well as portions of the gate dielectric layer 300) outside the trenches 270A, 270B, and 270C. As a result, this process forms fill metals 420A, 420B, and 420C, in the trenches 270A, 270B, and 270C, respectively. The fill metals 420A, 420B, and 420C serve as the main conductive portion of their respective gates 450A, 450B, and 450C. In various embodiments, the fill metals 420A, 420B, and 420C may contain materials such as tungsten (W), aluminum (Al), titanium (Ti), copper (Cu), or combinations thereof. In some embodiments, a blocking layer may also be formed between the work function metals 310A, 310B, 310C and the fill metals 420A, 420B, 420C, respectively. The blocking layer is configured to block or reduce diffusion between the work function metal and the fill metal. In some embodiments, the blocking layer contains titanium nitride (TiN) or tantalum nitride (TaN).

As a result of the processes performed according to the various aspects of the present discussed above, there is sufficient (i.e., not too much or too little) amount of room in the trenches 270A and 270B. The fill metals 420A and 420B can easily fill the trenches 270A and 270B, and as such the resulting gate electrodes will have a desired amount of resistance (i.e., not too high or too low). If the processes of the present disclosure had not been performed, then it is likely that the work function metal in trench 270A would be substantially taller than the work function metal in trench 270B, and there may not be a sufficient amount of fill metal formed in trench 270A, which can lead to degraded resistance of the corresponding gate electrode. Here, the gate resistance is improved, for example both the gate electrodes in trenches 270A and 270B will have similar and well-controlled gate resistances).

It is understood that the coating and etch-back processes of the present disclosure may be performed more than twice. For example, in some embodiments, after the second coating process is performed (as shown in FIG. 9, following the first etch-back process 350 performed in FIG. 8) to form additional anti-reflective material 330, an additional etch-back may be performed, followed by a third coating process. At that point, the anti-reflective material may have a surface topography that is even more uniform. The final etch-back process and the subsequent metal pull-back process discussed above with reference to FIGS. 11-12 may then be performed. In this manner, the coating and etch-back processes discussed above may be repeated more than once.

Additional fabrication processes may be performed to complete the fabrication of the semiconductor device 35. For example, these additional processes may include formation of conductive contacts for the gates and source/drain regions, deposition of passivation layers, formation of interconnect structures (e.g., metal lines and vias, metal layers, and interlayer dielectric that provide electrical interconnection to the device including the formed metal gate), packaging, and testing. For the sake of simplicity, these additional processes are not described herein. It is also understood that some of the fabrication processes for the various embodiments discussed above may be combined depending on design needs and manufacturing requirements.

It is understood that the fabrication process discussed above with reference to FIGS. 1-14 pertain to a "high-k"-last gate replacement process. In other words, the gate dielectric layer 300 containing the high-k dielectric material is formed after the removal of the dummy gate electrodes 120A, 120B, and 120C. Alternatively, the concepts of the present disclosure may also apply to a gate-last gate replacement process, where a gate dielectric layer containing the high-k gate dielectric material is formed first, and the dummy gate electrodes are formed on the high-k gate dielectric material. In that case, the removal of the dummy gate electrodes does not remove the high-k gate dielectric material, and the work function metal layer would then be formed over the high-k gate dielectric material. Regardless of whether the "gate-last" approach is used or the "high-k last" approach is used, the repeated coating and etch-back processes as discussed above help reduce the surface topography unevenness that is caused by loading effects. As a result, the formation of the fill metal of the gate electrode can still be improved.

It is also understood that the multiple coating and etch-back processes discussed above may apply not just in the gate replacement context. Rather, the approach of repeating the cycle of a coating process followed by an etch-back process may be implemented in other semiconductor fabrication contexts, for example in the formation of vias or contacts. Other suitable candidates for the application of the present disclosure include situations where loading effect is a concern, for example when multiple small (e.g., narrow) openings are formed adjacent to a significantly larger (e.g., wider) opening.

Figure 15:
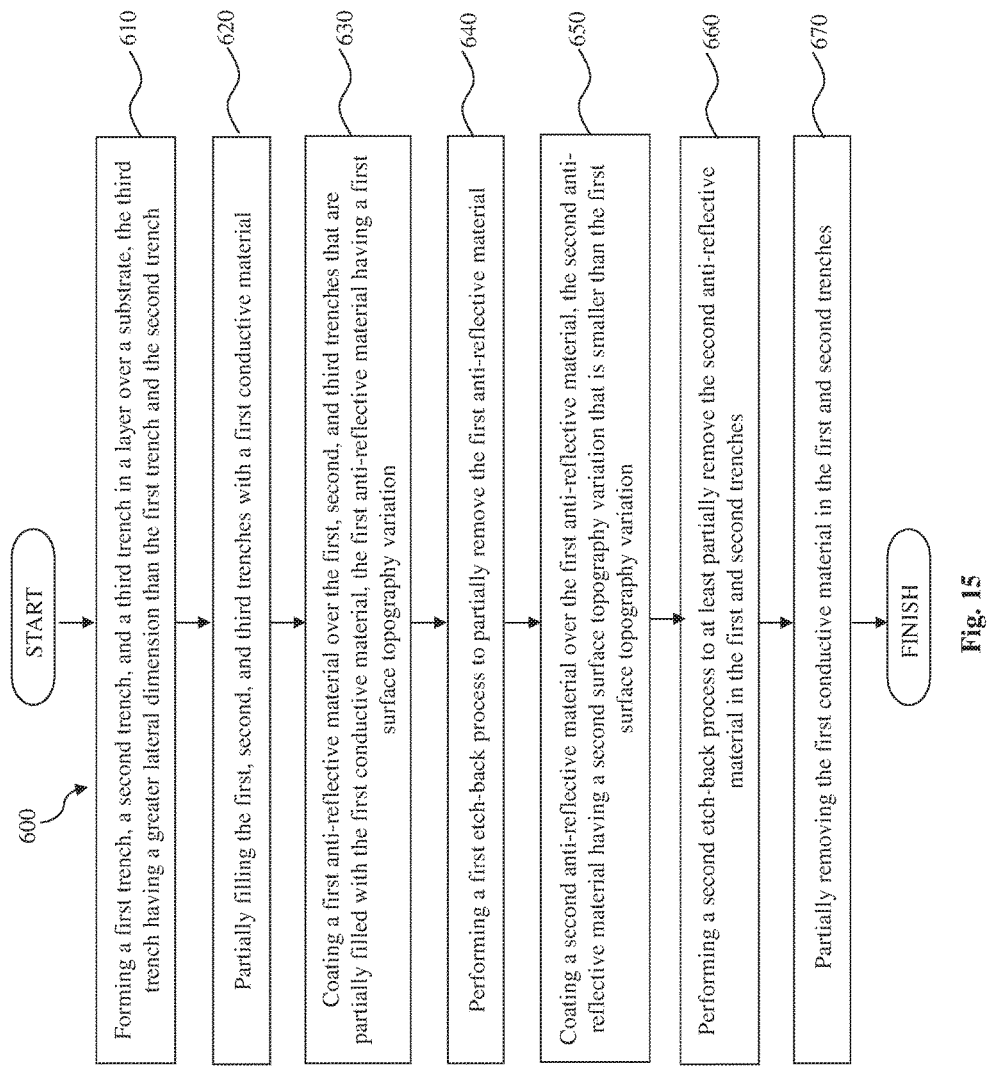
FIG. 15 is a flowchart illustrating a method of fabricating a semiconductor device in accordance with embodiments of the present disclosure.

FIG. 15 is a flowchart illustrating a method 600 of fabricating a semiconductor device according to embodiments of the present disclosure. The method 600 includes a step 610 of forming a first trench, a second trench, and a third trench in a layer over a substrate. The third trench has a greater lateral dimension than the first trench and the second trench. In some embodiments, the forming of the first, second, and third trenches is performed such that the lateral dimension of the third trench is at least three times greater than a lateral dimension of the first or a lateral dimension of the second trench. In some embodiments, the forming of the first, second, and third trenches is performed such that the lateral dimension of the first trench is substantially equal to the lateral dimension of the second trench.

The method 600 includes a step 620 of partially filling the first, second, and third trenches with a first conductive material.

The method 600 includes a step 630 of coating a first anti-reflective material over the first, second, and third trenches that are partially filled with the first conductive material. The first anti-reflective material has a first surface topography variation. In some embodiments, the coating of the first anti-reflective material is performed such that the first surface topography variation is caused by a loading effect. According to the first topography variation: a first portion of the first anti-reflective material disposed over the first trench is taller than a second portion of the first anti-reflective material disposed over the second trench, and the second portion of the first anti-reflective material is taller than a third portion of the first anti-reflective material disposed over the third trench.

The method 600 includes a step 640 of performing a first etch-back process to partially remove the first anti-reflective material.

The method 600 includes a step 650 of coating a second anti-reflective material over the first anti-reflective material. The second anti-reflective material has a second surface topography variation that is smaller than the first surface topography variation, in some embodiments, the coating of the second anti-reflective material is performed such that the second anti-reflective material has a same material composition as the first anti-reflective material.

The method 600 includes a step 660 of performing a second etch-back process to at least partially remove the second anti-reflective material in the first and second trenches.

The method 600 includes a step 670 of partially removing the first conductive material in the first and second trenches. After the step 670 is performed, a first portion of the first conductive material disposed in the first trench has a first height, a second portion of the first conductive material disposed in the second trench has second first height. A difference between the first height and the second height is within a certain percentage of the first height or the second height.

It is understood that additional steps may be performed before, during, and after the steps 610-670 of the method 600. For example, in some embodiments, before the performing of the second etch-back process, a photoresist is formed to cover a portion of the second anti-reflective material disposed over the third trench. The second etch-back process removes portions of the second anti-reflective material not covered by the photoresist. As another example, after the first conductive material is partially removed, the method 600 may include a step of completely removing the second anti-reflective material and a step of completely filling the first, second, and third trenches with a second conductive material. The first conductive material is a work function metal configured to tune a work function for a gate of a transistor, and the second conductive material is a fill metal serving as a main conductive portion of the gate of the transistor. As yet another example, the method 600 may include a step of, before the forming the first, second, and third trenches: forming a first dummy gate, a second dummy gate, and a third dummy gate, wherein the first, second, and third trenches are formed by removing the first, second, and third dummy gates, respectively.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiment.

One advantage is that the processes of the present disclosure can reduce the coating loading between different patterns. As discussed above, by repeating the coating of the anti-reflective material and then repeating the etch-back process, the surface topography variation of the anti-reflective material is substantially reduced. This allows the anti-reflective materials in the trenches to have relatively even heights after the last etching-back process is performed, which in turn allows the work function metals in the trenches to have relatively even heights. As a result, the subsequent fill metal deposition for the metal gate electrode is improved, which allows the metal gates to have improved resistance. Another advantage is that the processes of the present disclosure are compatible with existing fabrication process flow, etc.

One aspect of the present disclosure involves a method of fabricating a semiconductor device. A first trench, a second trench, and a third trench are formed in a layer over a substrate. The third trench has a greater lateral dimension than the first trench and the second trench. The first, second, and third trenches are partially filled with a first conductive material. A first anti-reflective material is coated over the first, second, and third trenches that are partially filled with the first conductive material. The first anti-reflective material has a first surface topography variation. A first etch-back process is performed to partially remove the first anti-reflective material. After the first etch-back process is performed, a second anti-reflective material is coated over the first anti-reflective material. The second anti-reflective material has a second surface topography variation that is smaller than the first surface topography variation. A second etch-back process is performed to at least partially remove the second anti-reflective material in the first and second trenches. After the second etch-back process is performed, the first conductive material is partially removed in the first and second trenches.

Another aspect of the present disclosure involves a method of fabricating a semiconductor device. A first opening, a second opening, and a third opening are formed in a dielectric layer over a substrate. The first, second, and third openings have first, second, and third widths, respectively. The third width is at least three times wider than the first width or the second width. The first, second, and third openings are partially filled with a work function metal. The work function metal is configured to tune a work function of a gate of a transistor. A bottom anti-reflecting coating (BARC) material is formed over the work function metal in the first, second, and third openings. A first height difference exists between a first portion of the BARC material disposed over the first opening and a second portion of the BARC material disposed over the second opening. A first etch-back process is performed to partially remove the BARC material. Additional BARC material is formed on the etched-back BARC material. A second height difference exists between a first portion of the additional BARC material disposed over the first opening and a second portion of the additional BARC material disposed over the second opening. The second height difference is smaller than the first height difference. A photoresist material is formed over a third portion of the additional BARC material over the third opening. A second etch-back process is performed to the first and second portions of the additional BARC material. The photoresist material serves as a mask during the second etch-back process. Thereafter, the work function metal is partially removed in the first and second openings. After the work function metal is partially removed, the work function metal disposed in the first opening and the work function metal disposed in the second opening have a height difference that is no greater than the second height difference.

Yet another aspect of the present disclosure involves a semiconductor device. The semiconductor device includes a substrate. The semiconductor device also includes a first gate, a second gate, and a third gate disposed over the substrate. The third gate has a greater lateral dimension than the first gate and the second gate. The first, second, and third gates include first, second, and third work function metal components, respectively. The first, second, and third work function metal components are configured to tune a respective work function of the first, second, and third gates, respectively. A height of the first work function metal component is within a certain percentage of a height of the second work function metal component.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor device, comprising:
a substrate; and
a first gate, a second gate, and a third gate disposed over the substrate, wherein the second gate is disposed between the first gate and the third gate;
wherein:
the third gate has a greater lateral dimension than the first gate and the second gate;
the first, second, and third gates include first, second, and third work function metal components, respectively, wherein the first, second, and third work function metal components are configured to tune a respective work function of the first, second, and third gates, respectively; and
a height of the first work function metal component is greater than a height of the second work function metal component but is less than a height of the third work function metal component.
2. The semiconductor device of claim 1, wherein a height of the third work function metal component substantially exceeds the height of the first work function metal component or the height of the second work function metal component.

3. The semiconductor device of claim 1, wherein a lateral dimension of the first gate is different from a lateral dimension of the second gate.
4. The semiconductor device of claim 1, wherein the height of the first work function metal component is greater than the height of the second work function metal component by no more than 60%.
5. The semiconductor device of claim 4, wherein the height of the first work function metal component is greater than the height of the second work function metal component by no more than 30%.
6. The semiconductor device of claim 1, wherein a lateral dimension of the first gate is substantially equal to a lateral dimension of the second gate.
7. The semiconductor device of claim 1, wherein the lateral dimension of the third gate exceeds a respective lateral dimension of the first gate or a lateral dimension of the second gate by a factor of 3 or more.
8. The semiconductor device of claim 1, wherein the first, second, and third gates each include a respective high-k gate dielectric component.
9. The semiconductor device of claim 1, wherein the first, second, and third work function metal components each have a U-shape.
10. The semiconductor device of claim 1, wherein:
the first, second, and third gates include first, second, and third fill function metal components, respectively;
an upper surface of the first fill metal component is disposed over an upper surface of the first work function metal component; and
an upper surface of the third fill metal component is substantially co-planar with an upper surface of the third work function metal component.
11. A semiconductor device, comprising:
a substrate;
a first gate having a first lateral dimension disposed over the substrate, the first gate including a first work function metal layer having a first height;
a second gate having a second lateral dimension disposed over the substrate, the second gate including a second work function metal layer having a second height; and
a third gate having a third lateral dimension disposed over the substrate, the third gate including a third work function metal layer having a third height;
wherein:
the second gate is located between the first gate and the third gate;
the third lateral dimension is greater than the first lateral dimension and the second lateral dimension;
the third height is greater than the first height; and
the first height is greater than the second height.
12. The semiconductor device of claim 11, wherein the first lateral dimension is at least three times wider than each of the first lateral dimension and the second lateral dimension.
13. The semiconductor device of claim 12, wherein the first lateral dimension is within about 50% and about 200% of the second lateral dimension.
14. The semiconductor device of claim 12, wherein the first lateral dimension is substantially equal to the second lateral dimension.
15. The semiconductor device of claim 11, wherein a difference between the first height and the second height is within 30% of the second height.

16. The semiconductor device of claim 11, wherein:

the first work function metal layer, the second work function metal layer, and the third work function metal layer each have a U-shaped cross-sectional profile;

the first gate further includes a first high-k gate dielectric layer disposed under the first work function metal layer and a first fill metal layer disposed over the first work function metal layer;

the second gate further includes a second high-k gate dielectric layer disposed under the second work function metal layer and a second fill metal layer disposed over the second work function metal layer; and the third gate further includes a third high-k gate dielectric layer disposed under the third work function metal layer and a third fill metal layer disposed over the third work function metal layer.

17. The semiconductor device of claim 16, wherein the third work metal function layer and the third fill metal layer have substantially co-planar upper surfaces.

18. A semiconductor device, comprising:

a substrate;

a first gate disposed over the substrate, the first gate having a first lateral dimension and including a first high-k gate dielectric layer, a first work function metal layer disposed over the first high-k gate dielectric layer, and a first fill metal layer disposed over the first work function metal layer;

a second gate disposed over the substrate, the second gate having a second lateral dimension and including a second high-k gate dielectric layer, a second work function metal layer disposed over the second high-k gate dielectric layer, and a second fill metal layer disposed over the second work function metal layer; and a third gate disposed over the substrate, the third gate having a third lateral dimension and including a third high-k gate dielectric layer, a third work function metal layer disposed over the third high-k gate dielectric layer, and a third fill metal layer disposed over the third work function metal layer;

wherein:

the second gate is located between the first gate and the third gate;

the third lateral dimension is greater than each of the first lateral dimension and the second lateral dimension;

the first lateral dimension is within about 50% and about 200% of the second lateral dimension;

a first height of the first work function metal layer is greater than a second height of the second work function metal layer; and a third height of the third work function metal layer is greater than the first height.

19. The semiconductor device of claim 18, wherein a difference between the first height and the second height is within 30% of the second height.

20. The semiconductor device of claim 18, wherein:

an upper surface of the first fill metal layer is disposed over an upper surface of the first work function metal layer;

an upper surface of the second fill metal layer is disposed over an upper surface of the second work function metal layer; and the third work function metal layer and the third fill metal layer have substantially co-planar upper surfaces.

* * * * *